(12) United States Patent
Sun et al.

(10) Patent No.: US 11,444,091 B2
(45) Date of Patent: Sep. 13, 2022

(54) METHOD OF MAKING MEMORY CELLS, HIGH VOLTAGE DEVICES AND LOGIC DEVICES ON A SUBSTRATE

(71) Applicant: Silicon Storage Technology, Inc., San Jose, CA (US)

(72) Inventors: Jack Sun, Shanghai (CN); Chunming Wang, Shanghai (CN); Xian Liu, Sunnyvale, CA (US); Andy Yang, Shanghai (CN); Guo Xiang Song, Shanghai (CN); Leo Xing, Shanghai (CN); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 38 days.

(21) Appl. No.: 17/129,865

(22) Filed: Dec. 21, 2020

(65) Prior Publication Data
US 2021/0398995 A1 Dec. 23, 2021

(30) Foreign Application Priority Data
Jun. 23, 2020 (CN) .......................... 202010581174.7

(51) Int. Cl.
*H01L 21/00* (2006.01)
*H01L 27/11531* (2017.01)
(Continued)

(52) U.S. Cl.
CPC .. *H01L 27/11531* (2013.01); *H01L 27/11524* (2013.01); *H01L 27/11529* (2013.01); *H01L 29/42328* (2013.01); *H01L 29/66825* (2013.01)

(58) Field of Classification Search
CPC ......... H01L 27/11531; H01L 27/11524; H01L 27/11529; H01L 29/42328; H01L 29/66825
See application file for complete search history.

(56) References Cited

U.S. PATENT DOCUMENTS 5,292,681 A * 3/1994 Lee ................... H01L 27/11546
438/258
5,352,620 A * 10/1994 Komori ............ H01L 29/40114
438/258
(Continued)

FOREIGN PATENT DOCUMENTS

TW 200527658 A 8/2005
WO 2019/112756 6/2019

OTHER PUBLICATIONS

PCT Search Report and Written Opinion dated Apr. 29, 2021from the related PCT Patent Application No. US20/66727 filed on Dec. 22, 2020.

*Primary Examiner* — Richard A Booth
(74) *Attorney, Agent, or Firm* — DLA Piper LLP (US)

(57) ABSTRACT

A method of forming a semiconductor device by recessing the upper surface of a semiconductor substrate in first and second areas but not a third area, forming a first conductive layer in the first and second areas, forming a second conductive layer in all three areas, removing the first and second conductive layers from the second area and portions thereof from the first area resulting in pairs of stack structures each with a control gate over a floating gate, forming a third conductive layer in the first and second areas, forming a protective layer in the first and second areas and then removing the second conductive layer from the third area, then forming blocks of conductive material in the third area, then etching in the first and second areas to form select and HV gates, and replacing the blocks of conductive material with blocks of metal material.

11 Claims, 21 Drawing Sheets

(51) Int. Cl.
*H01L 27/11524* (2017.01)
*H01L 29/66* (2006.01)
*H01L 29/423* (2006.01)
*H01L 27/11529* (2017.01)

(56) References Cited

U.S. PATENT DOCUMENTS

| | | | |
|---|---|---|---|
| 6,297,092 B1 * | 10/2001 | Rudeck | H01L 29/40114 438/257 |
| 6,747,310 B2 | 6/2004 | Fan et al. | |
| 7,868,375 B2 | 1/2011 | Liu et al. | |
| 7,927,994 B1 | 4/2011 | Liu et al. | |
| 9,276,005 B1 | 3/2016 | Zhou et al. | |
| 10,325,919 B1 | 6/2019 | Teng et al. | |
| 2020/0144276 A1 | 5/2020 | Liu et al. | |

\* cited by examiner

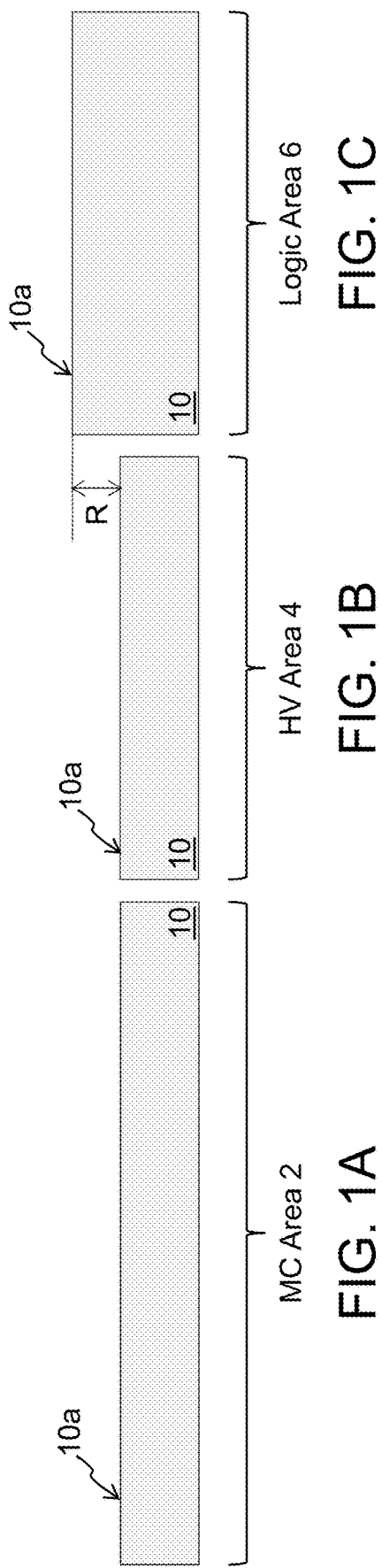

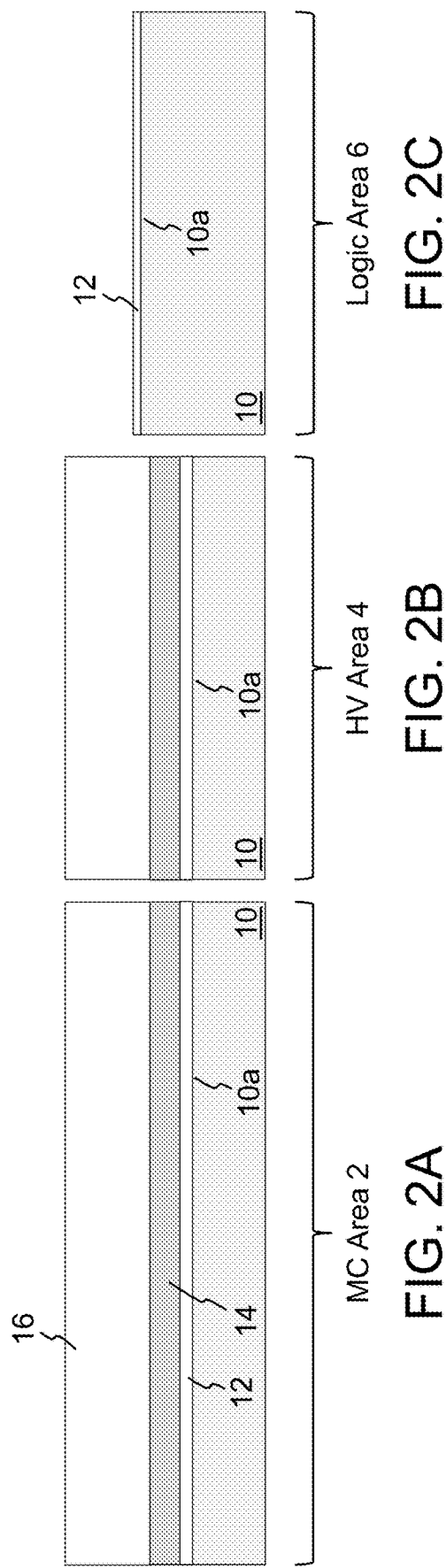

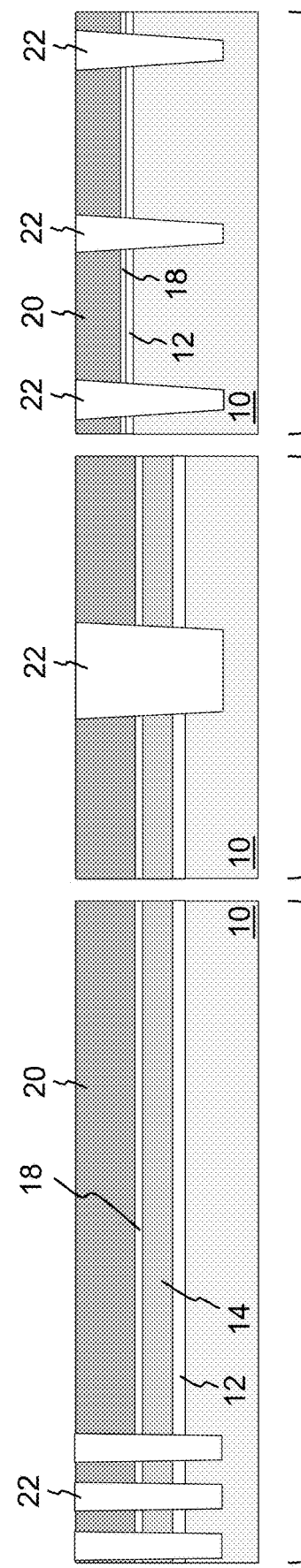

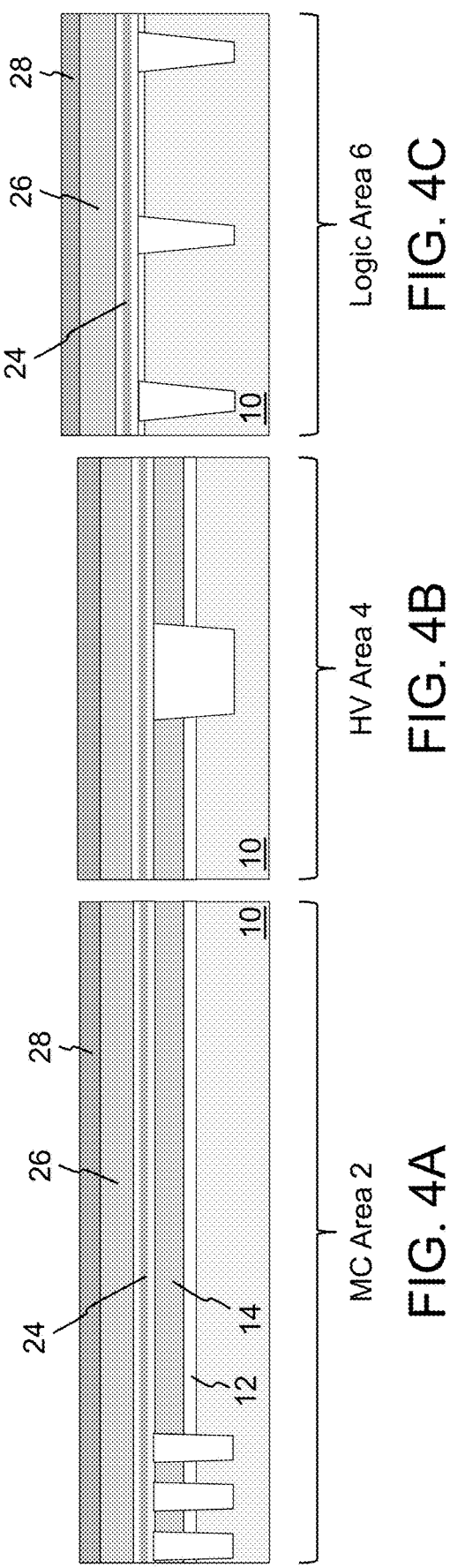

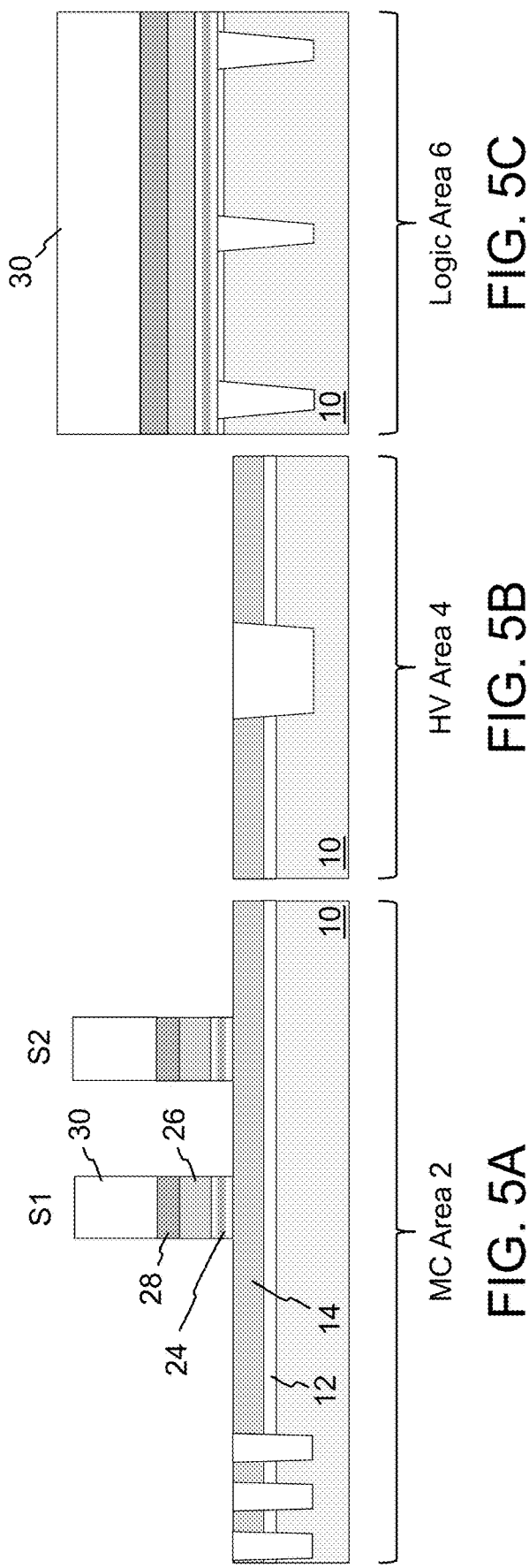

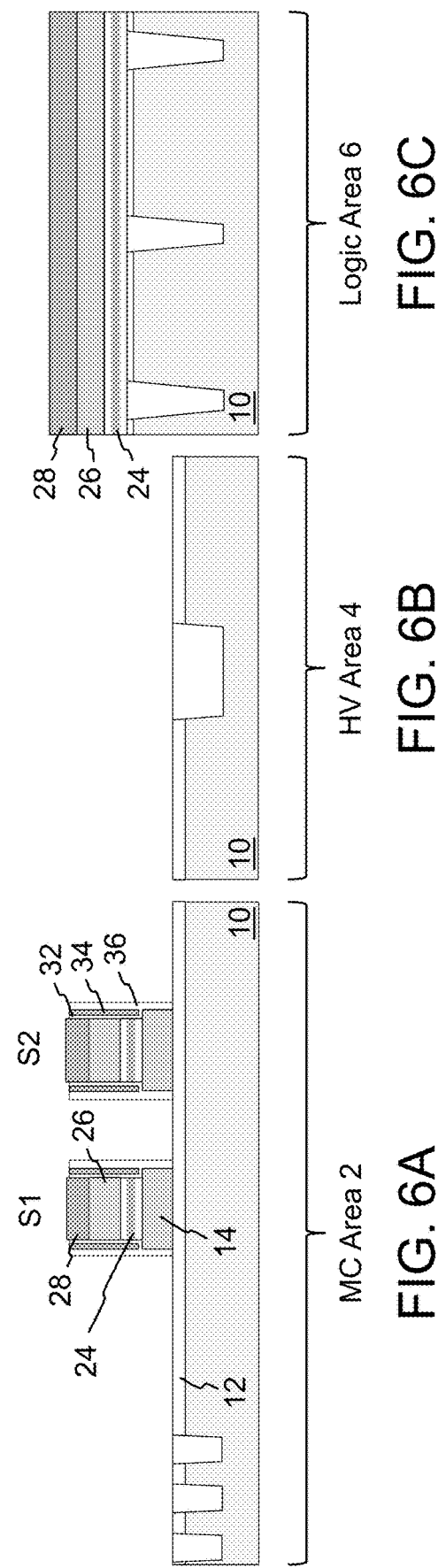

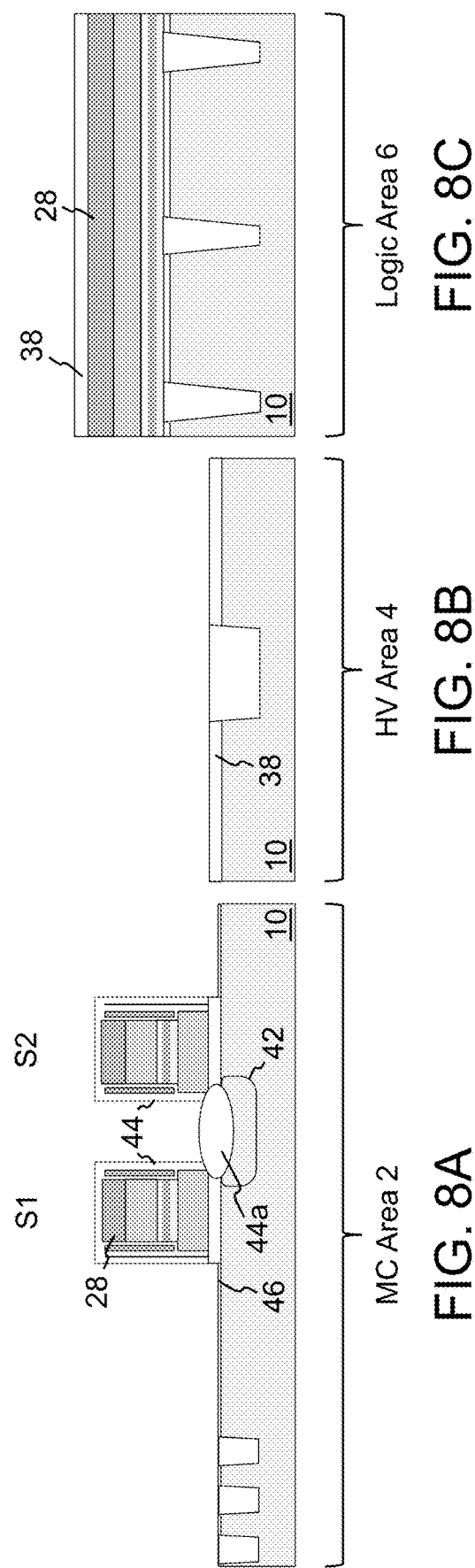

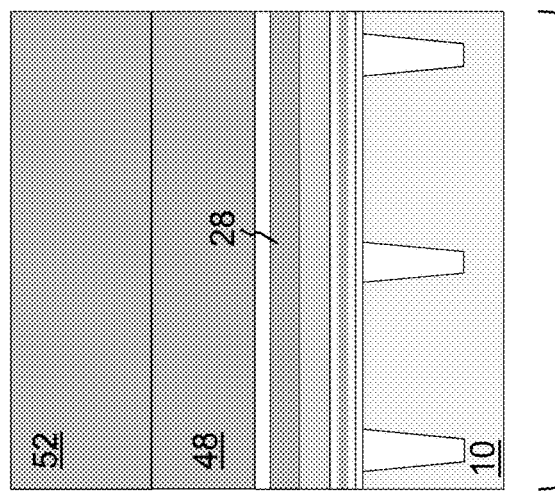
FIG. 9C  Logic Area 6
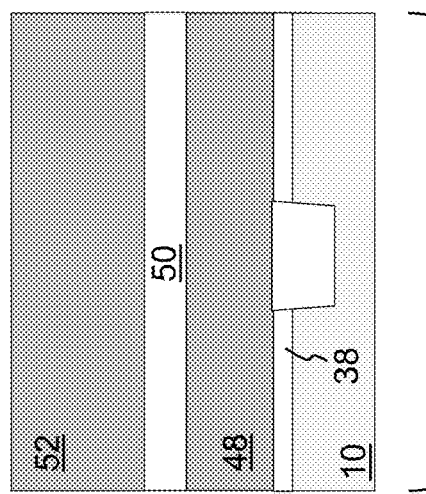
FIG. 9B  HV Area 4
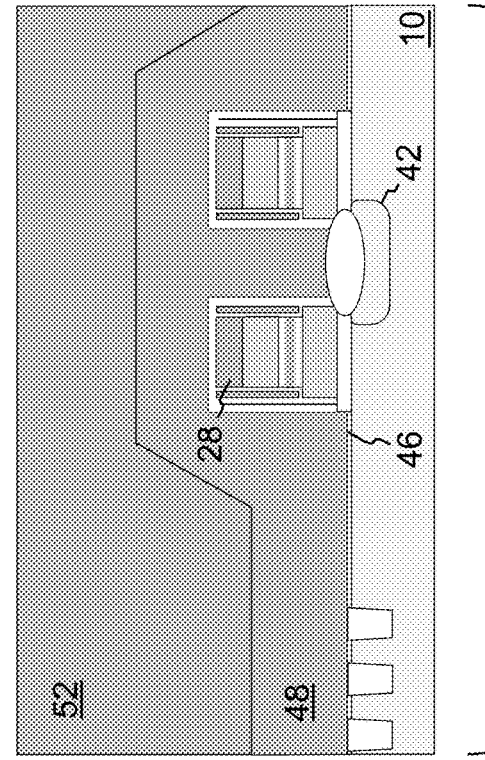
FIG. 9A  MC Area 2

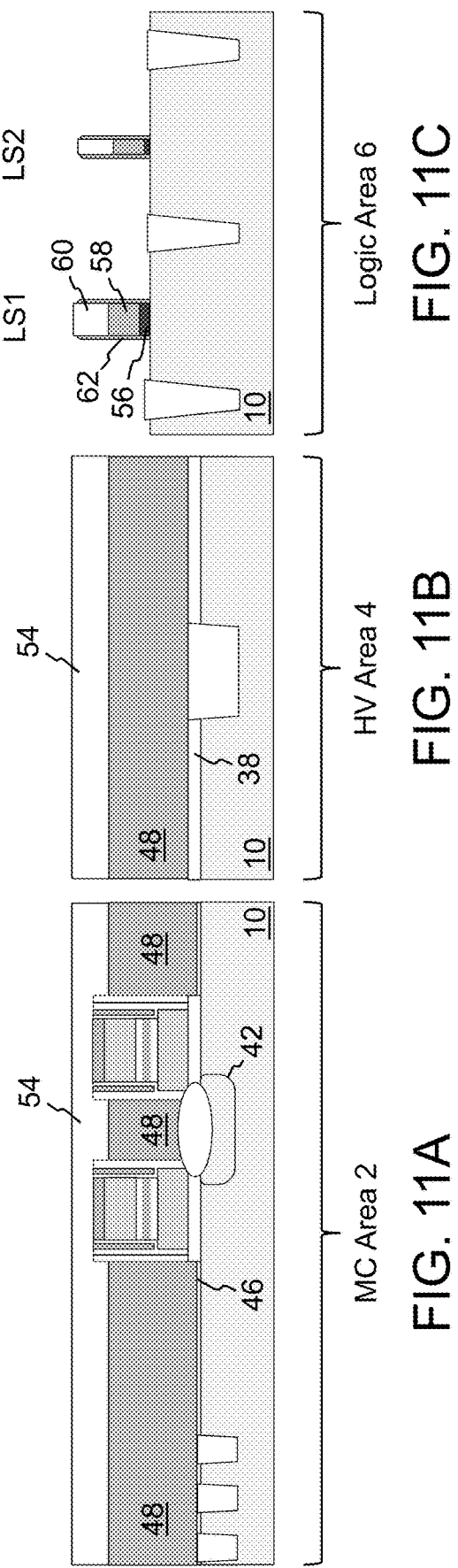

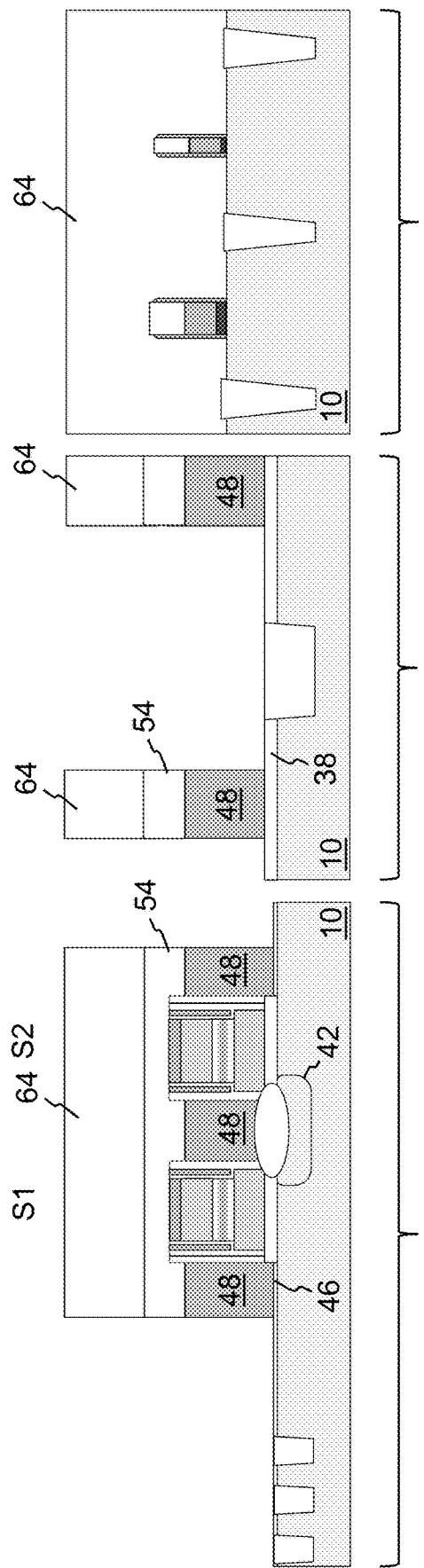

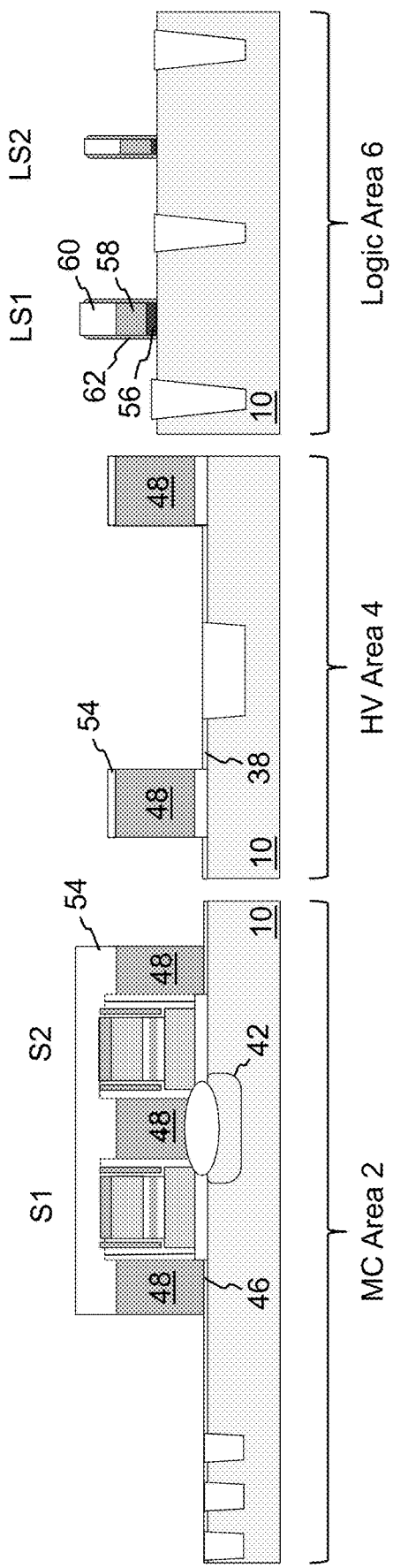

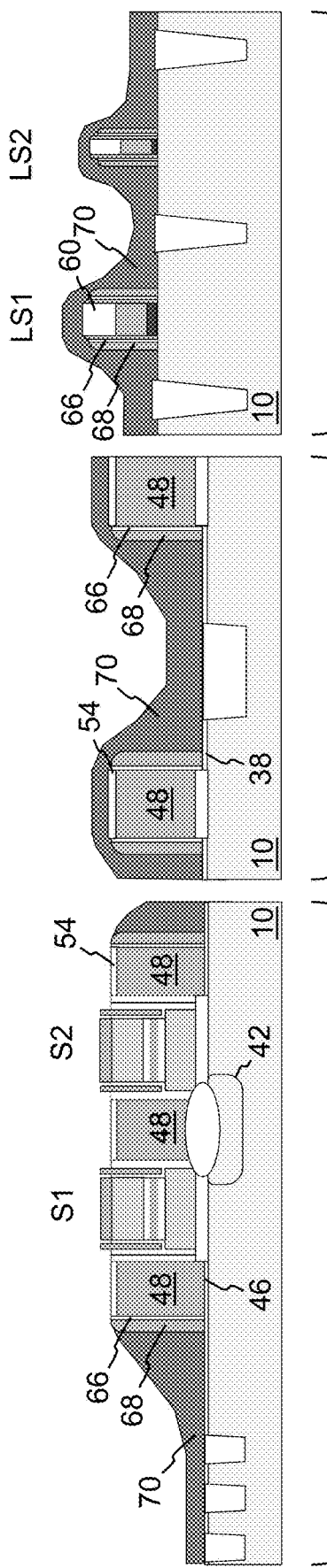

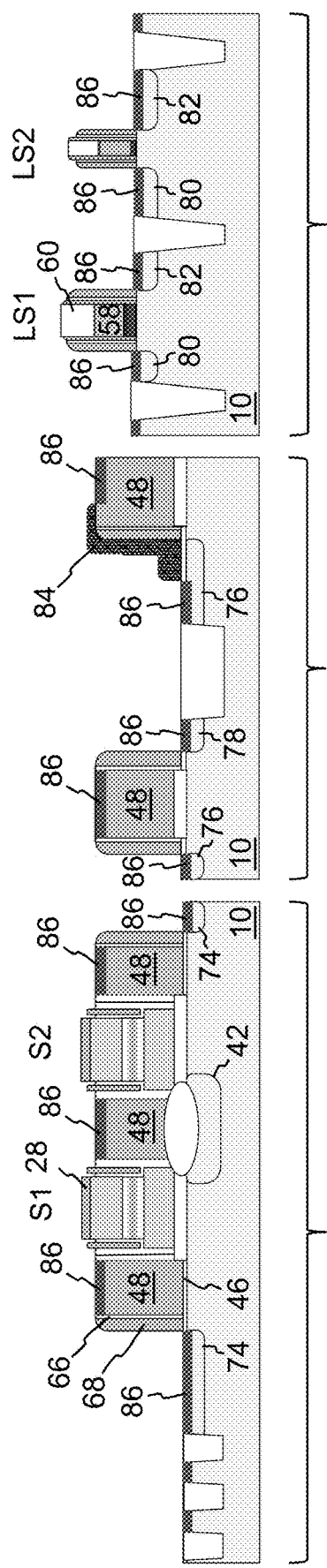

METHOD OF MAKING MEMORY CELLS, HIGH VOLTAGE DEVICES AND LOGIC DEVICES ON A SUBSTRATE

PRIORITY CLAIM

This application claims priority to Chinese Patent Application No. 202010581174.7, filed on Jun. 23, 2020, and titled "Method of Making Memory Cells, High Voltage Devices and Logic Devices on a Substrate."

FIELD OF THE INVENTION

The present invention relates to semiconductor devices with embedded non-volatile memory cells.

BACKGROUND OF THE INVENTION

Non-volatile memory semiconductor devices formed on silicon semiconductor substrates are well known. For example, U.S. Pat. Nos. 6,747,310, 7,868,375 and 7,927,994 disclose memory cells with four gates (floating gate, control gate, select gate and erase gate) formed on a semiconductor substrate, which are incorporated herein by reference for all purposes. Source and drain regions are formed as diffusion implant regions into the substrate, defining a channel region therebetween in the substrate. The floating gate is disposed over and controls the conductivity of a first portion of the channel region, the select gate is disposed over and controls the conductivity of a second portion of the channel region, the control gate is disposed over the floating gate, and the erase gate is disposed over the source region and laterally adjacent to the floating gate.

It is also known to form low and high voltage logic devices on the same substrate as the non-volatile memory cells. See for example U.S. Pat. No. 9,276,005, which is incorporated herein by reference for all purposes. New gate materials such as high K dielectric and metal gates are also used to increase performance. However, processing steps in forming the memory cells can adversely affect the concurrently fabricated logic devices, and vice versa.

There is a need for an improved method of making a device that includes memory cells, low voltage logic devices and high voltage devices on the same substrate.

BRIEF SUMMARY OF THE INVENTION

The aforementioned problems and needs are addressed by a method of forming a semiconductor device, which includes:
  providing a substrate of semiconductor material that includes a first area, a second area and a third area;
  recessing an upper surface of the substrate in the first area and an upper surface of the substrate in the second area relative to an upper surface of the substrate in the third area;
  forming a first conductive layer disposed over and insulated from the upper surfaces in the first and second areas;
  forming a second conductive layer disposed over and insulated from the first conductive layer in the first and second areas, and disposed over and insulated from the upper surface in the third area;
  performing one or more etches to selectively remove portions of the first and second conductive layers in the first area, to entirely remove the first and second conductive layers from the second area, while maintaining the second conductive layer in the third area, wherein the one or more etches result in pairs of stack structures in the first area with each of the stack structures including a control gate of the second conductive layer disposed over and insulated from a floating gate of the first conductive layer;
  forming first source regions in the substrate each disposed between one of the pairs of stack structures;
  forming a third conductive layer disposed over and insulated from the upper surfaces of the substrate in the first and second areas;
  forming a protective layer over the third conductive layer in the first and second areas;
  after the forming of the protective layer, removing the second conductive layer from the third area;
  after the removing of the second conductive layer from the third area, forming blocks of conductive material disposed over and insulated from the upper surface in the third area;
  after the forming of the blocks of conductive material in the third area, etching portions of the protective layer and portions of the third conductive layer in the first and second areas to form a plurality of select gates of the third conductive layer each disposed adjacent to one of the stack structures and to form a plurality of HV gates of the third conductive layer each disposed over and insulated from the upper surface in the second area;
  forming first drain regions in the substrate each adjacent to one of the select gates;
  forming second source regions in the substrate each adjacent one of the HV gates;
  forming second drain regions in the substrate each adjacent one of the HV gates;
  forming third source regions in the substrate each adjacent one of the blocks of conductive material;
  forming third drain regions in the substrate each adjacent one of the blocks of conductive material; and
  replacing each of the blocks of conductive material with a block of metal material.

Other objects and features of the present invention will become apparent by a review of the specification, claims and appended figures.

BRIEF DESCRIPTION OF THE DRAWINGS

FIGS. 1A-16A are cross sectional views of the memory cell area showing the steps in forming the memory cells.

FIGS. 1B-16B are cross sectional views of the HV area showing the steps in forming the HV devices.

FIGS. 1C-16C are cross sectional views of the logic area showing the steps in forming the logic devices.

DETAILED DESCRIPTION OF THE INVENTION

Figure 7C:
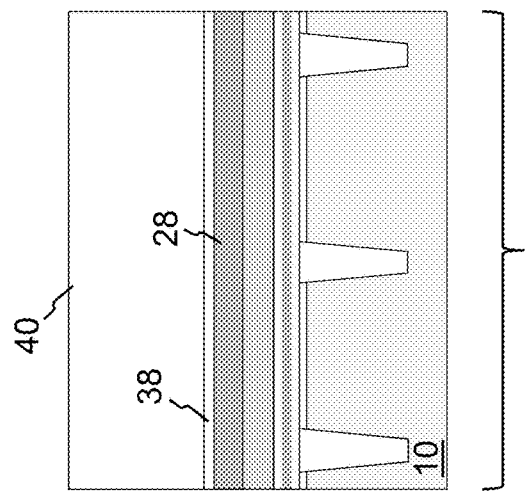

The present invention is a process of forming a semiconductor device by simultaneously forming memory cells, low voltage logic devices and high voltage logic devices on the same semiconductor substrate. The process described below involves forming memory cells in one or more memory cell areas (also referred to as first or MC areas) 2 of the substrate 10, high voltage logic devices in one or more high voltage logic device areas (also referred to as second or HV areas) 4 of the substrate 10, and low voltage logic devices in one or more low voltage logic device areas (also referred to a third or Logic areas) 6 of the substrate 10. The process is described with respect to forming a pair of memory cells in a MC area 2, a high voltage logic device in an HV area 4, and a lower voltage logic device in a logic area 6, simultaneously. However, multiple such devices in each area are simultaneously formed. Substrate 10 is a substrate of semiconductor material (e.g., silicon).

Referring to FIGS. 1A-16A for the MC area 2, FIGS. 1B-16B for the HV area 4, and FIGS. 1C-16C for the Logic area 6, there are shown cross-sectional views of the steps in the process to make a semiconductor device. The process begins by recessing the upper surface 10a of the silicon substrate 10 in the MC area 2 and HV area 4 by a recess amount R relative to the Logic area 6. Recessing the substrate upper surface 10a is preferably performed by forming a silicon dioxide (hereinafter "oxide") layer on the substrate upper surface 10a and a silicon nitride (hereinafter "nitride") layer on the oxide layer. A photolithography masking step is performed to cover the logic area 6 but not the MC and HV areas 2/4 with photoresist (i.e., form photoresist over all three areas, selectively expose portion(s) of the photoresist, and selectively remove portion(s) of the photoresist, leaving exposed portion(s) of the underlying structure (in this case the nitride layer in the MC and HV areas 2/4), while leaving other portion(s) of the underlying structure covered by the photoresist (in this case the nitride layer in the Logic area 6). Nitride and oxide etches are performed to remove these layers from the MC and HV areas 2/4, leaving the upper surface 10a in these areas exposed. After photoresist removal, a thermal oxidation is then performed to form an oxide layer on the exposed portions of the upper surface 10a in the MC and HV areas 2/4. This thermal oxidation process consumes some of the silicon of the substrate, effectively lowering the upper surface 10a in these areas. Nitride and oxide etches are then used to remove all the oxide and nitride layers, resulting in the structure shown in FIGS. 1A, 1B and 1C. The upper surface 10a in the MC and HV areas 2/4 is recessed by an amount R (e.g., 200-700 A) relative to the upper surface 10a in the Logic area 6.

Next, an oxide layer 12 is formed on the upper surface 10a (e.g., by deposition or by thermal growth, etc.). Thereafter, a conductive layer such a polysilicon (hereinafter "poly") 14 is formed on oxide layer 12. Poly layer 14 could instead be amorphous silicon, either in-situ doped or undoped. An implantation and anneal is performed if undoped polysilicon or amorphous silicon is used for layer 14. A photolithography masking step is then performed to cover the MC and HV areas 2/4 with photoresist 16, but leaving the logic area 6 exposed (i.e., the photoresist 16 is removed from the logic area 6 as part of the masking step). A poly etch is then used to remove poly layer 14 from the logic area 6, as shown in FIGS. 2A, 2B and 2C.

After photoresist 16 is removed, an optional oxide layer 18 is formed over the structure, followed by a nitride layer 20 formed on oxide layer 18. A photolithography masking step is used to selectively cover portions of each area with photoresist. Nitride, oxide, poly and silicon etches are used to form trenches through nitride 20, oxide 18, poly 14, oxide 12 and into silicon substrate 10. Preferably the trenches are 2000 A-3500 A deep in the logic area 6 of substrate 10, and 1600A-3300A deep in the MC and HV areas 2/4 of substrate 10. The trenches are then filled with oxide 22 by oxide deposition and chemical mechanical polish (CMP) stopping on nitride layer 20, as shown in FIGS. 3A, 3B and 3C. Oxide 22 can also be referred to as STI (shallow trench isolation), which is a well know isolation technique. Oxide 22 can include a liner oxide formed by thermal oxidation before the oxide deposition.

A series of implants can be performed to create the desired wells in the substrate 10 in each of the areas 2/4/6 (with photoresist protecting one or more of the other areas during each implantation), followed by an oxide etch back to recess the STI oxide 22 below the top of nitride layer 20. A nitride etch is then used to remove nitride layer 20. An insulation layer 24 is then formed over the structure. Preferably, the insulation layer 24 is an ONO composite layer with oxide/nitride/oxide sublayers (formed by oxide, nitride, oxide depositions and anneal). However, insulation layer 24 could instead be formed of a composite of other dielectric layers, or a single dielectric material with no sublayers. A conductive layer such as polysilicon layer 26 is then formed on the structure by polysilicon deposition. Poly layer 26 could instead be amorphous silicon, either in-situ doped or undoped. A poly implantation and anneal is performed if undoped polysilicon or amorphous silicon is used for layer 14. A hard mask layer 28 is then formed on poly layer 26. Hard mask layer 28 can be nitride, SiCN, or even a composite of oxide, nitride and/or SiCN layers. The resulting structure is shown in FIGS. 4A, 4B and 4C.

A photolithography masking step is used to form photoresist 30 on the structure, where it is removed from the HV area 4 and selectively removed from the MC area 2 to expose layer 28 in the HV area 4 and expose only portions of layer 28 in the MC area 2. A series of etches are used to remove exposed portions of hard mask layer 28, poly layer 26 and ONO layer 24, leaving pairs of spaced apart stack structures S1 and S2 of hard mask layer 28, poly layer 26 and ONO layer 24 in the MC area 2, and entirely removing these layers from the HV area 4. The resulting structure is shown in FIGS. 5A, 5B and 5C.

After photoresist 30 is removed, an oxide deposition or thermal oxidation and etch are used to form spacers 32 along the sides of stacks S1 and S2 in the MC area 2. A nitride deposition and etch are used to form nitride spacers 34 along the sides of oxide spacers 32. The oxide and nitride etches could be combined. A poly etch is performed to remove the exposed portions of poly layer 14, with the result that each spaced apart stack structure S1/S2 includes a block of poly 14 as well. Poly layer 14 is entirely removed from the HV area 4. Oxide spacers 36 are formed on the sides of the stack structures S1/S2 including along the exposed ends of the block of poly layer 14 by oxide deposition and oxide anisotropic etch, as shown in FIGS. 6A, 6B and 6C.

A photolithographic masking step is used to cover MC and Logic areas 2/6 with photoresist, but leave exposed HV area 4. An oxide etch is used to remove oxide layer 12 from the HV area 4. After photoresist removal, insulation layer 38 is then formed on the substrate upper surface 10a in the HV area 4 by thermal growth and/or deposition, as well as on the structures in the MC and Logic areas 2/6. Insulation layer 38 can be oxide and/or oxynitride, and will serve as the gate oxide for the HV devices. However, it should be noted that the removal and replacement of oxide 12 with insulation layer 38 is optional, and oxide 12 could instead be used as part of, or the entirety of, the gate oxide for the HV devices.

Figure 7B:
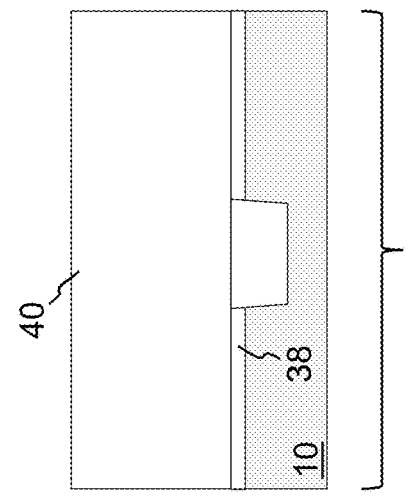
Figure 7A:
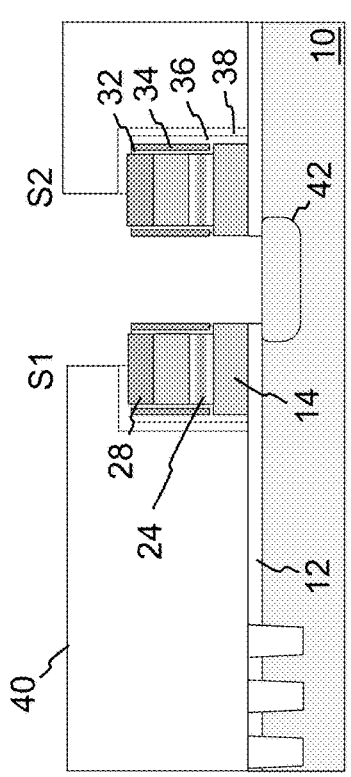

After photoresist removal, photoresist 40 is formed on the structure and only removed from the area between the stacks S1 and S2 (referred to herein as the inner stack area) in the MC area 2. An implantation process is performed to form source regions 42 in the substrate between the stacks S1 and S2. An oxide etch is then used to remove oxide layer 38, oxide spacers 36 and the oxide layer 12 in the inner stack areas. The resulting structure is shown in FIGS. 7A, 7B and 7C.

After photoresist 40 removal, a tunnel oxide 44 is formed on the structure. The tunnel oxide 44 could be oxide and/or oxidenitride formed by deposition and/or thermal growth. Because of catalytic effects of the higher dopant levels in the source region 42, tunnel oxide 44 can have a thicker portion 44a on the source region 42. A photolithographic masking step is used to cover the HV and Logic areas 4/6, and the inner stack area in the MC area, with photoresist. The areas on the other sides of stack structures S1 and S2 (referred to herein as the outer stack areas) are left exposed. An implant can be performed at this time for the portions of substrate 10 in the outer stack areas (i.e., those substrate portions that will be under the select gates to be formed later). An oxide etch is used to remove exposed oxide layer 12 in the outer stack areas. After photoresist removal, oxide layer 46 is then formed on the structure. Oxide layer 46 can be oxide and/or oxynitride or any other appropriate dielectric material, formed by deposition and/or thermal growth. The formation of oxide layer 46 thickens or becomes part of tunnel oxide 44 and insulation layer 38. The resulting structure is shown in FIGS. 8A, 8B and 8C.

Figures 10A, 10B, 10C:
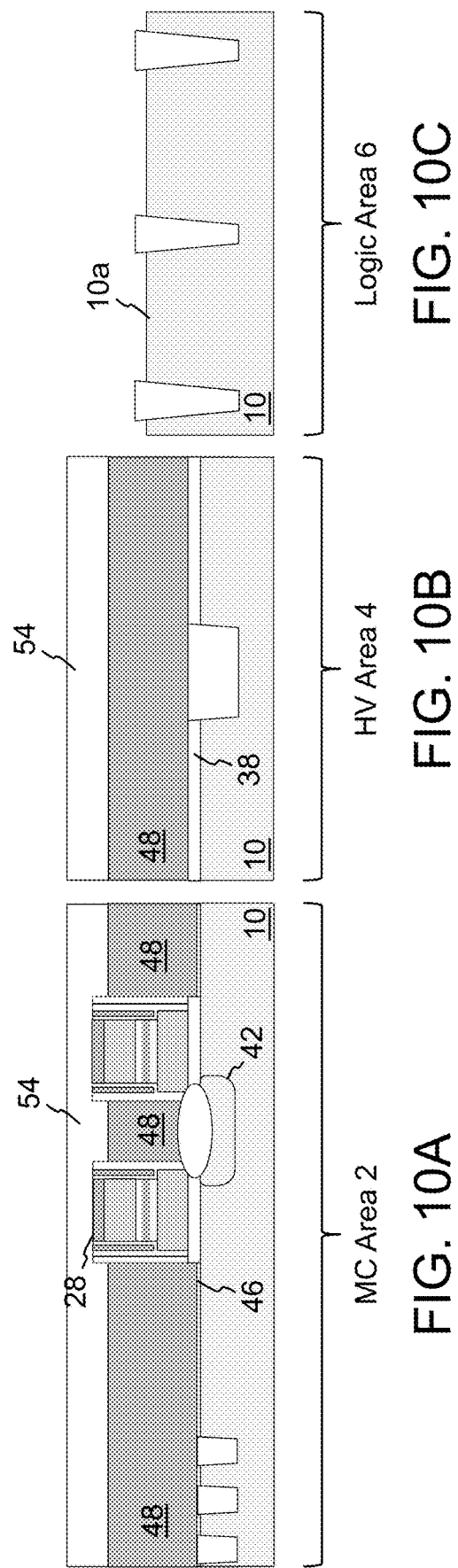

A conductive layer such as polysilicon layer 48 is formed on the structure. Poly layer 48 can be in-situ doped or undoped, and could instead be amorphous silicon. Doping and anneal would then be performed if undoped polysilicon or amorphous silicon is used for layer 48. A buffer oxide layer 50 is formed on poly layer 48. A photolithography masking step is used to cover the buffer oxide layer 50 in the HV area 4, but leave buffer oxide layer 50 exposed in the MC and Logic areas 2/6. The exposed portions of buffer oxide layer 50 are then removed by oxide etch in the MC and logic areas 2/6. After photoresist removal, a conductive layer such as polysilicon layer 52 is then deposited on the structure (which could instead be amorphous silicon with the same doping as poly layer 48), as shown in FIGS. 9A, 9B and 9C. A poly chemical mechanical polish (CMP) is performed to planarize the top surface of the structure, stopping on the hard mask layer 28. A further poly etch back process is used to recess the poly layer 48 upper surface below the tops of stacks S1 and S2. This completes the majority of the memory cell formation. An oxide etch is used to remove the buffer oxide 50 in the HV area 4. A protective insulation layer 54 is formed over the structure. Layer 54 can be oxide, nitride, SiCN or combinations thereof. A photolithographic masking step is used to cover the MC and HV areas 2/4 with photoresist, while leaving the logic area 6 exposed. An etch is used to remove protective layer 54 in the logic area 6. After photoresist removal, a series of etches are then performed to remove all the layers of material in the logic area 6, leaving the upper surface 10a of the substrate exposed, as shown in FIGS. 10A, 10B and 10C. The protective layer 54 protects the MC and HV areas 2/4 from this series of etches.

Implantations can be performed at this time to form doped P and N wells in the substrate 10 in the logic area 6. A dielectric layer 56 is formed on the exposed substrate upper surface 10a in the logic area 6 (which can serve as the gate dielectric for the logic devices). Dielectric layer 56 can be silicon oxide, silicon oxynitride, a high-K dielectric layer, or a composite thereof. A high K insulation material is insulation material having a dielectric constant K greater than that of silicon dioxide. Examples of high K insulation materials include $HfO_2$, $ZrO_2$, $TiO_2$, $Ta_2O_5$, and combinations thereof. A dummy conductive layer such as polysilicon layer 58 is then formed over the structure. A hard mask layer 60 is then formed on dummy poly layer 58. A photolithography masking step is used to cover select portions of the logic area 6 with photoresist, leaving hard mask layer 60 in the entire MC and HV areas 2/4, as well as part of the logic area 6 exposed. An etch is then used to remove the exposed areas of the hard mask layer 60 in the MC, HV, and logic areas 2/4/6. After photoresist removal, etches are used to remove the exposed portions of dummy poly layer 58 and dielectric 56 (i.e., all portions not protected by the remaining portions of hard mask layer 60 in the logic area 6), leaving logic stack structures LS1 and LS2 in the logic area 6. Dielectric spacers 62 are formed on the sides of logic stack structures LS1/LS2 by deposition and etch. Implantations into the substrate 10 in the logic area 6 can be performed at this time. The resulting structure is shown in FIGS. 11A, 11B and 11C.

A photolithography masking step is used cover the logic area 6, portions of HV area 4, and portions of the MC area 2, with photoresist 64 (i.e., cover the inner stack area, stack structures S1 and S2, and those portions of the outer stack areas immediately adjacent stack structures S1 and S2). Etches are used to remove exposed portions of protective layer 54 and poly layer 48, as shown in FIGS. 12A, 12B and 12C. After photoresist 64 is removed, additional selective implantations and etches can be performed in the different exposed portions of substrate 10 (i.e., by additional photolithography mask steps and implantations). For example, the HV and logic areas 4/6 can be covered by photoresist leaving MC area 2 exposed, and the portions of substrate 10 only covered by oxide layer 46 are subjected to implantation. The MC and logic areas 2/6 can be covered by photoresist leaving HV area 4 exposed, and the portions of substrate 10 only covered by oxide layer 38 are subjected to implantation. Further, an oxide etch can be used to thin oxide layer 38 (which also thins protective layer 54 in the HV area 4). The resulting structure is shown in FIGS. 13A, 13B and 13C.

Oxide and nitride depositions, followed by a spacer etch, are used to form oxide spacers 66 and nitride spacers 68 on the sides of stack structures S1/S2 in the MC area 2, on the sides of stack structures LS1/LS2 in the logic area 6, and on the sides of the structures in the HV area 4. A semi-nonconformal layer 70 is formed on the structure. This layer carries some of the conformality of the underlying topography, but is thinner at the tops of the underlying topography compared to where vertical and horizontal surfaces meet. To achieve such a varying thickness, a flowable material is preferably used to form layer 70. One non-limiting exemplary material for semi-nonconformal layer 70 is a BARC material (bottom anti-reflectant coating), which is commonly used to reduce reflectivity at resist interfaces during photolithography. BARC materials are flowable and wettable, and are easily etched and removed with minimal process damage due their high selectivity relative to oxide. Other materials that can be used for semi-nonconformal layer 70 include photoresist or spin-on-glass (SOG). A photolithographic masking step is used to cover the HV and Logic areas 4/6 with photoresist, while leaving MC area 2 exposed. An etch (e.g., anisotropic) is used to remove semi-nonconformal layer 70 from, and to expose, protective layer 54 on the stack structures S1/S2 and on poly blocks 48, while keeping semi-nonconformal layer 70 covering oxide layer 46 (i.e., this portion of semi-nonconformal layer 70 acts as a hard mask for the next etch step). An etch is used to thin or remove protective layer 54 on the stack structures S1/S2 and to thin the protective layer on poly blocks 48 adjacent to the stack structures S1/S2. The resulting structure is shown in FIGS. 14A, 14B and 14C (after photoresist removal).

After removal of semi-nonconformal layer 70, implantations are performed to form drain regions 74 in the substrate adjacent the spacers 68 in the MC area 2, source and drain regions 76/78 adjacent the spacers 68 in the HV area 4, and source and drain regions 80/82 adjacent the spacers 68 in the logic area 6. Implantations for any given region can be performed by forming photoresist to block the implantation for other region(s) not to be implanted. For example, drain regions 74 in the MC area 2, source/drain regions 76/78 in the HV area 4, and source/drain regions 80/82 in the logic area 6, of the same doping type, can be formed simultaneously by forming photoresist on area of the opposite source/drain doping type, and then performing a single implantation in the MC, HV, and logic areas 2/4/6. A blocking layer 84 can be formed at this time by deposition, masking step and etch, for blocking any silicidation in the next step. Any remaining portions of protective layer 54 in the MC and HV areas 2/4, which are not protected by blocking layer 84, are also removed during above etch, exposing gate poly 48 to subsequent silicidation. Metal deposition and anneal is then performed to form silicide on the top surfaces of exposed blocks of poly 48, source regions 76/80 and drain regions 74/78/82. Blocking layer 84 prevents silicide formation for any portions for which such formation is not desired. Optionally, blocking layer 84 can be maintained in select portions of the source/drain areas 74/76/78/80/82 and/or the poly gate areas 48, to block silicide formation in these select regions. The resulting structure is shown in FIGS. 15A, 15B and 15C.

Figures 16A, 16B, 16C:
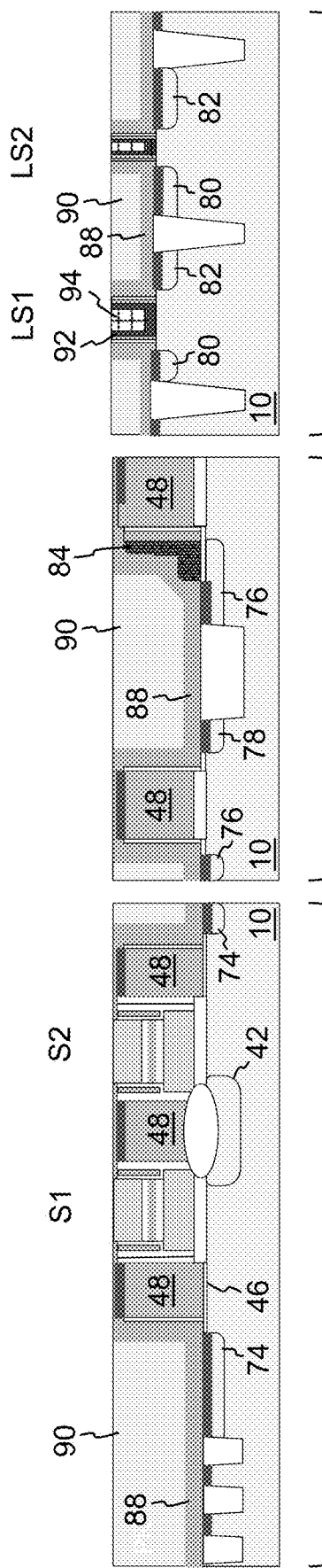

Etches are used to remove remaining portions of hard mask layer 60 on the stack structures LS1/LS2 in the logic area 6, nitride layer 28 on the stack structures S1/S2 in the MC area 2, and any exposed nitride spacers 68 in all three areas. A layer 88 (e.g., nitride) is formed over the structure. A thick layer of inter-layer dielectric (ILD) insulation material 90 is then formed on layer 88. CMP is performed to planarize and recess the ILD insulation material 90 to expose dummy poly 58 in the Logic area 6. A photolithography masking step is used to cover the MC and HV areas 2/4 with photoresist, while leaving the Logic area 6 exposed. A poly etch is then used to remove the blocks of poly layer 58 in the logic area 6. Optionally, dielectric layer 56 can also be removed in this step. After photoresist removal, optionally, a dielectric layer 92, such as a silicon oxide, oxynitride, high-K dielectric layer, or a composite thereof, can be deposited over the structure. A layer of metal gate material 94 such as Al, Ti, TiAlN, TaSiN, TaN, TiN, or other appropriate metal material, etc. or a composite thereof, is formed over the dielectric layer 92. A CMP is then performed to remove the dielectric layer 92 and metal layer 94, leaving blocks of the metal 94 lined with the dielectric layer 92 in the logic area 6. The final structure is shown in FIGS. 16A, 16B and 16C.

Figure 17:
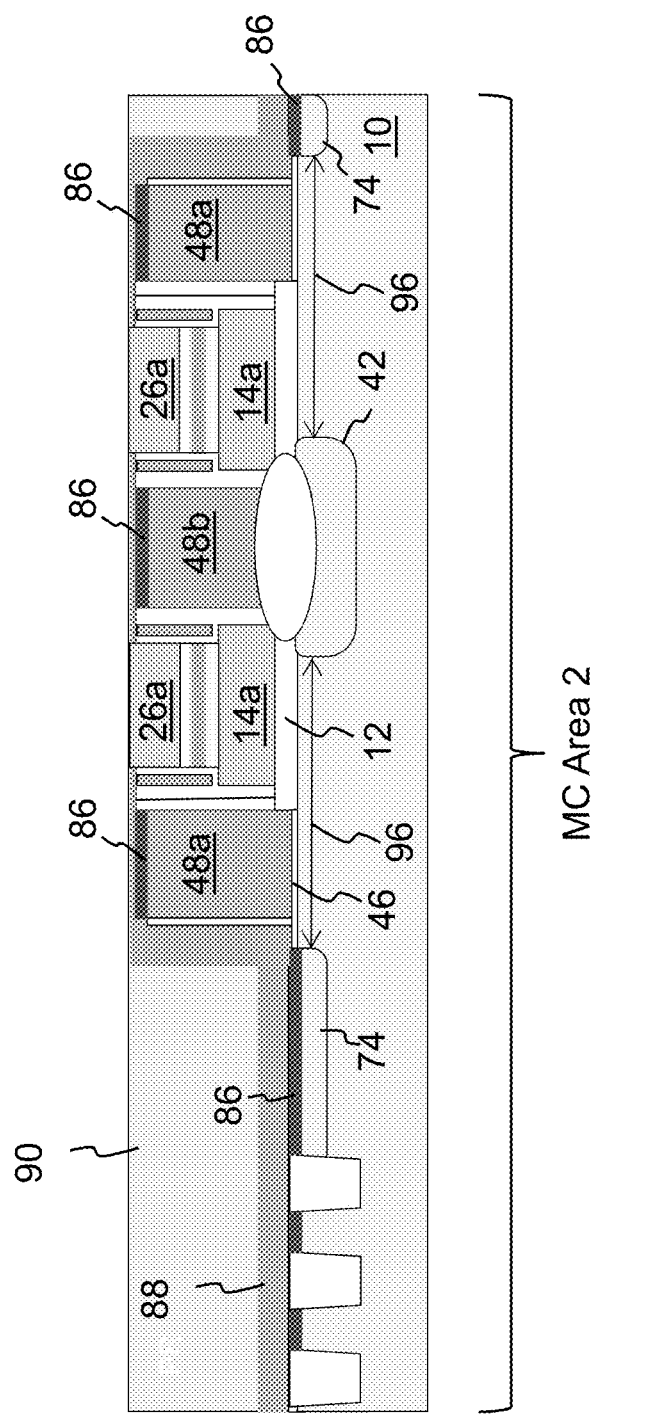
FIG. 17 is a cross sectional view of the memory cell area showing the finished memory cells.

FIG. 17 shows the final memory cell structure in the MC area 2, which includes pairs of memory cells each sharing a source region 42 spaced apart from two drain regions 74, with channel regions 96 in the silicon 10 extending there between. Each memory cell includes a floating gate 14a disposed over and insulated from a first portion of the channel region 96 for controlling the conductivity thereof, a select gate 48a (which can also be referred to a word line gate) disposed over and insulated from a second portion of the channel region 96 for controlling the conductivity thereof, a control gate 26a disposed over and insulated from the floating gate 14a, and an erase gate 48b disposed over and insulated from the source region 42 (shared by the pair of memory cells). The pairs of memory cells extend in the column direction (BL direction), and columns of the memory cells are formed, with insulation 22 between adjacent columns. A row of the control gates are formed as a continuous control gate line that connects the control gates together for an entire row of the memory cells. A row of the select gates are formed as a continuous select gate line (also known as a word gate line) that connects the select gates together for an entire row of the memory cells. A row of the erase gates are formed as a continuous erase gate line that connects the erase gates together for an entire row of pairs of the memory cells.

Figure 18:
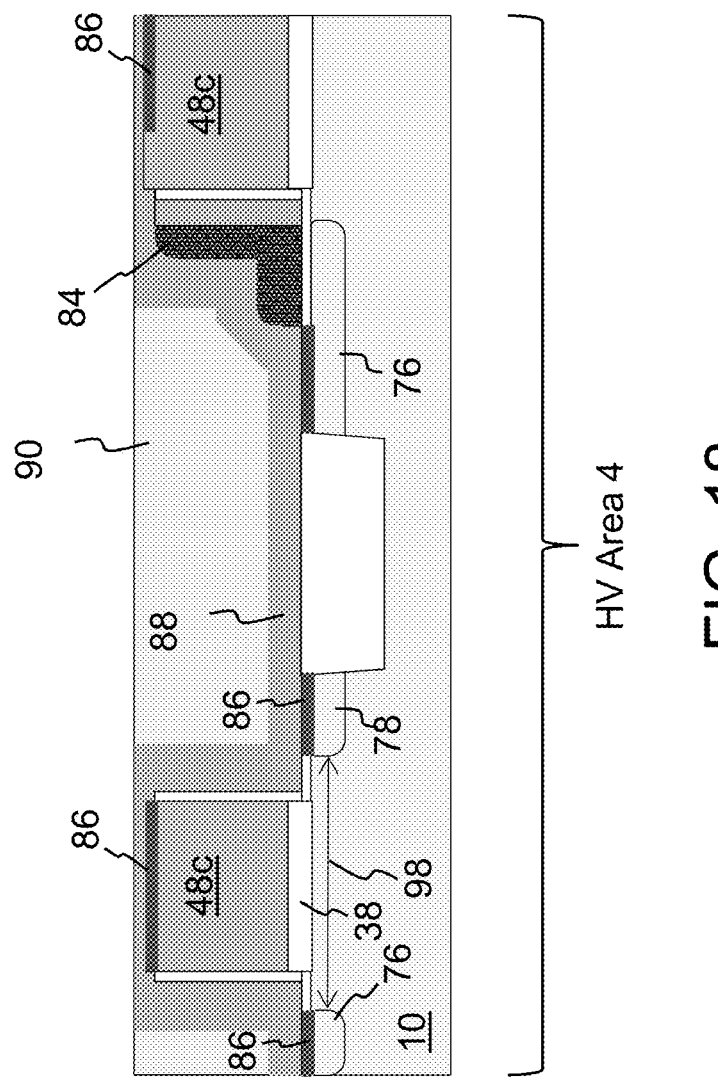
FIG. 18 is a cross sectional view of the HV area showing the finished HV devices.

The final HV devices are shown in FIG. 18. Each HV device includes spaced apart source and drain regions 76 and 78 with a channel region 98 of the silicon substrate 10 extending there between. A conductive gate 48c is disposed over and insulated from the channel region 98 for controlling the conductivity thereof.

Figure 19:
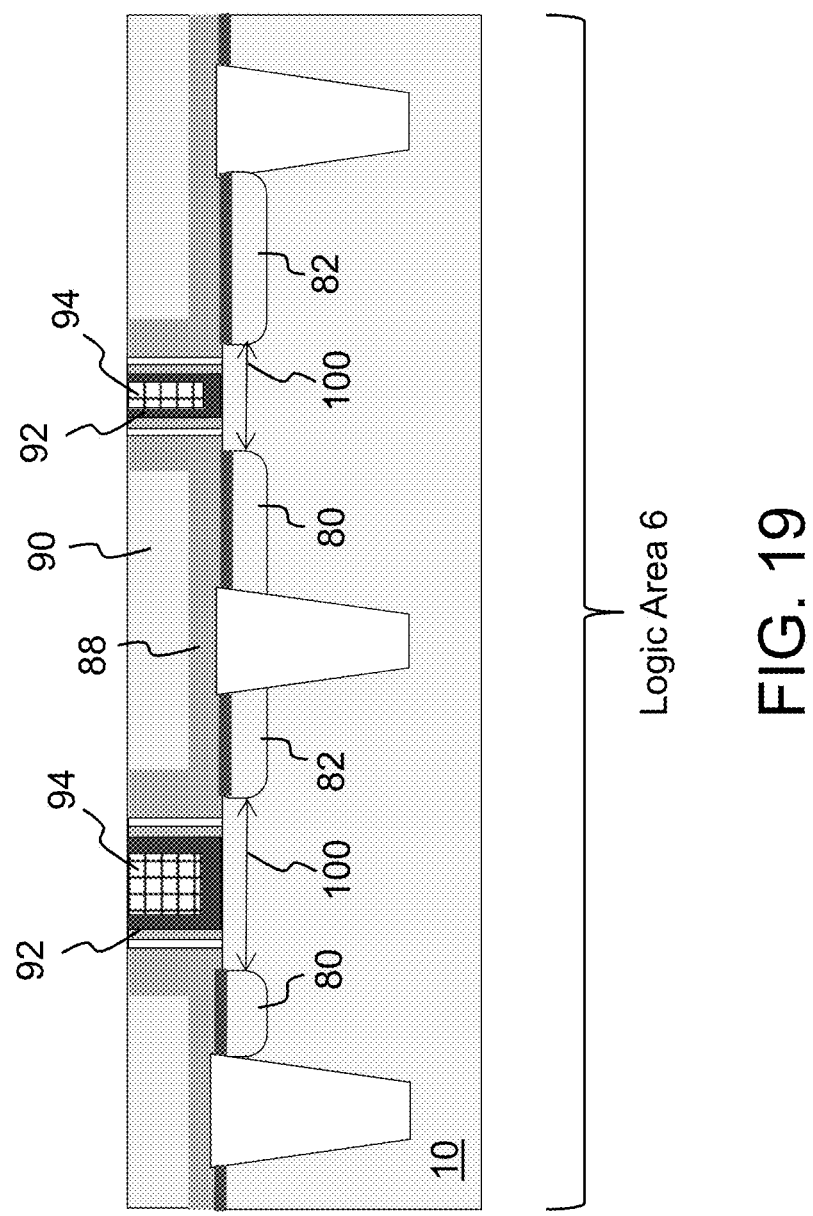
FIG. 19 is a cross sectional view of the logic area showing the finished logic devices.
Figure 20:
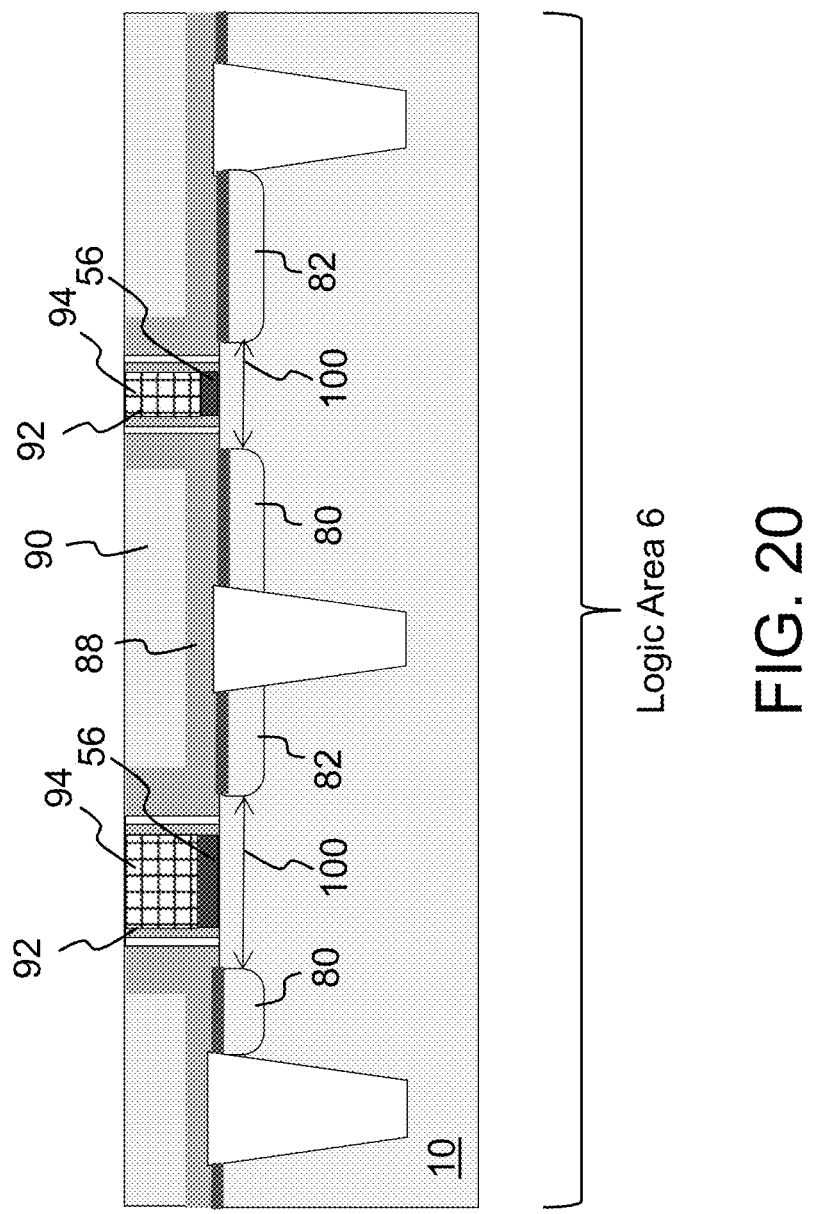
FIG. 20 is a cross sectional view of the logic area showing the finished logic devices in an alternate embodiment.
Figure 21:
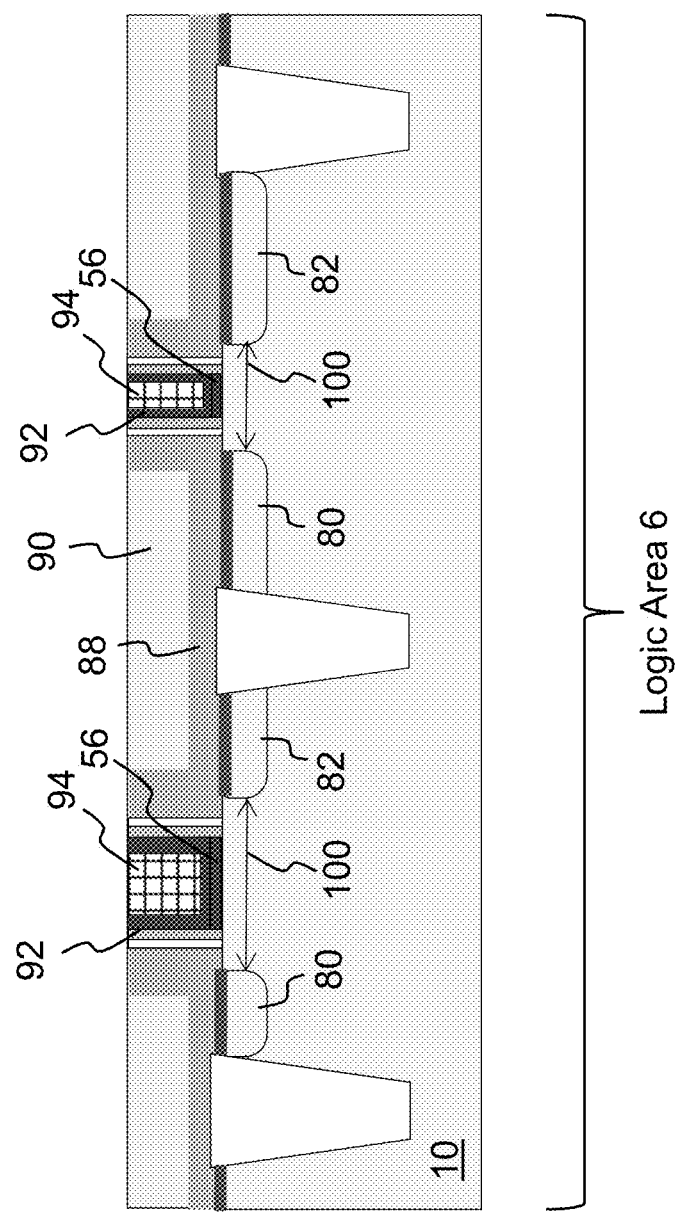
FIG. 21 is a cross sectional view of the logic area showing the finished logic devices in an alternate embodiment.

The final logic devices are shown in FIG. 19. Each logic device includes spaced apart source and drain regions 80 and 82 with a channel region 100 of the silicon substrate 10 extending there between. A metal gate 94 is disposed over and insulated from the channel region 100 (by dielectric layer 92) for controlling the conductivity thereof. FIG. 20 shows the final logic devices if the dielectric layer 56 is maintained, and the formation of dielectric layer 92 is omitted. FIG. 21 shows the final logic devices if the dielectric layer 56 is maintained and the dielectric layer 92 is formed.

There are a number of advantages of the above described method of forming memory cells, HV devices and logic devices on the same substrate. The memory cells and HV devices formation is completed before the optional high K dielectric and metal gates are formed in the logic area 6, so that the optional high K dielectric layer 92 and metal gates 94 in the logic area 6 will not be adversely affected by the formation of the memory cells and HV devices. The process steps for the formation of the gates in the MC and HV areas 2/4 are separate and independent from (and can be customized relative to) the process steps for the formation of the gates in the logic area 6. The MC and HV areas 2/4 are covered by protective layer 54 after most of the memory cell and HV device formation is completed and before the processing in the logic area 6 (i.e., before the removing of the layers in the logic area 6 left from the memory cell and HV device formation, and before the depositing and removing of the layers used for forming the logic devices including dummy poly removal, etc.). The upper surface 10a of the substrate 10 is recessed in the MC and HV areas 2/4 relative to that in the logic area 6 to accommodate the taller structurers in the MC/HV areas 2/4 (i.e., so that tops of the shorter logic devices in the logic area 6 are slightly higher than the tops of the taller memory cells and HV devices in the MC/HV areas 2/4, and so that CMP across all three areas can be used for processing—e.g., the tops of the select gates 48a and HV gates 48c are intact during logic gate formation CMP steps). Protective layer 88 protects the silicided poly blocks 48 from the CMP used in forming the metal logic gates 94, and the control gate poly 26 assists as a stop layer for this CMP. Silicide 86 enhances the conductivity of the drain regions 74, and source/drain regions 76/78, source/drain regions 80/82, select gates 48*a*, erase gates 48*b* and HV gates 48*c*. The semi-nonconformal layer 70 protects the oxide and silicon in the source/drain regions of the MC area 2 while protective layer 54 is being thinned. The memory cell select gates 48*a*, memory cell erase gates 48*b* and HV device gates 48*c*, can be formed using a single conductive material deposition (i.e., a single polysilicon layer formed by a single polysilicon deposition can be used to form all three types of gates). Moreover, the same poly etch can be used define one of the edges of each select gate 48*a* and both edges of each HV gate 48*c*. The thicknesses of the various gate oxides 46, 12, 38 and 56 are independent of each other with each optimized for its respective gate operation. For example, layer 46 under the select gates 48*a* is preferably thinner than layer 12 under the floating gates.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell area and the logic areas of the present invention, unless otherwise specified in the claims. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:
   providing a substrate of semiconductor material that includes a first area, a second area and a third area;
   recessing an upper surface of the substrate in the first area and an upper surface of the substrate in the second area relative to an upper surface of the substrate in the third area;
   forming a first conductive layer disposed over and insulated from the upper surfaces in the first and second areas;
   forming a second conductive layer disposed over and insulated from the first conductive layer in the first and second areas, and disposed over and insulated from the upper surface in the third area;
   performing one or more etches to selectively remove portions of the first and second conductive layers in the first area, to entirely remove the first and second conductive layers from the second area, while maintaining the second conductive layer in the third area, wherein the one or more etches result in pairs of stack structures in the first area with each of the stack structures including a control gate of the second conductive layer disposed over and insulated from a floating gate of the first conductive layer;
   forming first source regions in the substrate each disposed between one of the pairs of stack structures;
   forming a third conductive layer disposed over and insulated from the upper surfaces of the substrate in the first and second areas;
   forming a protective layer over the third conductive layer in the first and second areas;
   after the forming of the protective layer, removing the second conductive layer from the third area;
   after the removing of the second conductive layer from the third area, forming blocks of conductive material disposed over and insulated from the upper surface in the third area;
   after the forming of the blocks of conductive material in the third area, etching portions of the protective layer and portions of the third conductive layer in the first and second areas to form a plurality of select gates of the third conductive layer each disposed adjacent to one of the stack structures and to form a plurality of HV gates of the third conductive layer each disposed over and insulated from the upper surface in the second area, wherein for each of the pairs of stack structures, an erase gate of the third conductive layer is disposed between the pair of stack structures, and over and insulated from one of the source regions;
   after the forming of the plurality of select gates and the plurality of HV gates:
      forming a semi-nonconformal layer of flowable material in the first, second and third areas,
      removing a portion of the semi-nonconformal layer of flowable material from the protective layer in the first area while maintaining the semi-nonconformal layer of flowable material in the second and third areas,
      thinning the protective layer in the first area, and
      removing remaining portions of semi-nonconformal layer of flowable material in the first area and the semi-nonconformal layer of flowable material in the second and third areas;
   forming first drain regions in the substrate each adjacent to one of the select gates;
   forming second source regions in the substrate each adjacent one of the HV gates;
   forming second drain regions in the substrate each adjacent one of the HV gates;
   forming third source regions in the substrate each adjacent one of the blocks of conductive material;
   forming third drain regions in the substrate each adjacent one of the blocks of conductive material;
   removing the thinned protective layer in the first area to expose the select gates and the erase gate;
   forming silicide on the select gates and the erase gates; and
   replacing each of the blocks of conductive material with a block of metal material.

2. The method of claim 1, wherein each of the blocks of metal material is insulated from the upper surface in the third area by a layer of high K insulation material.

3. The method of claim 1, wherein before the replacing, each of the blocks of conductive material is insulated from the upper surface in the third area by a layer of high K insulation material, and wherein the replacing further comprises forming each of the blocks of metal material on the layer of high K insulation material.

4. The method of claim 1, wherein each of the first, second and third conductive layers is formed of polysilicon or amorphous silicon.

5. The method of claim 1, wherein the forming of the first conductive layer further includes forming the first conductive layer in the third area, and wherein the method further comprises removing the first conductive layer from the third area.

6. The method of claim 1, wherein the forming of the third conductive layer further includes forming the third conductive layer in the third area, and wherein the method further comprises removing the third conductive layer from the third area.

7. The method of claim 1, further comprising:
forming silicide on the first, second and third drain regions and on the second and third source regions.

8. The method of claim 1, further comprising:
forming silicide on the HV gates.

9. The method of claim 8, wherein after the forming of the silicide on the select gates, the erase gates and the HV gates, and before the replacing each of the blocks of conductive material with the block of metal material, the method further comprising:
forming a protective layer of material on the silicide in the first and second areas.

10. The method of claim 1, wherein for each of the stack structures, the control gate is insulated from the floating gate by an ONO insulation layer.

11. The method of claim 1, wherein after the forming of the third conductive layer, the method further comprising:
forming a layer of insulation material on the third conductive layer in the second area;
forming a dummy layer of conductive material on the third conductive layer in the first and third areas and on the layer of insulation material in the second area;
performing a chemical mechanical polish to remove the dummy layer of conductive material in the first, second and third areas; and then
removing the layer of insulation material from the second area.

* * * * *